(12) United States Patent
Klimczak et al.

(10) Patent No.: US 11,798,786 B2
(45) Date of Patent: Oct. 24, 2023

(54) POWER CONVERTER, POWER SUPPLY SYSTEM AND HF PLASMA SYSTEM

(71) Applicant: TRUMPF Huettinger Sp. z o. o., Zielonka (PL)

(72) Inventors: Andrzej Klimczak, Warsaw (PL); Konrad Lewandowski, Kobylka (PL); Marcin Golan, Warsaw (PL)

(73) Assignee: TRUMPF HUETTINGER SP. Z O. O., Zielonka (PL)

( * ) Notice: Subject to any disclaimer, the term of this patent is extended or adjusted under 35 U.S.C. 154(b) by 29 days.

(21) Appl. No.: 17/161,808

(22) Filed: Jan. 29, 2021

(65) Prior Publication Data

US 2021/0159050 A1    May 27, 2021

Related U.S. Application Data

(63) Continuation of application No. PCT/EP2019/070375, filed on Jul. 29, 2019.

(30) Foreign Application Priority Data

Aug. 2, 2018 (EP) .................................. 18461598

(51) Int. Cl.
  *H01J 37/32*    (2006.01)
  *H03F 3/21*    (2006.01)
  *H03F 3/217*    (2006.01)

(52) U.S. Cl.
  CPC ...... *H01J 37/32174* (2013.01); *H03F 3/2176* (2013.01)

(58) Field of Classification Search
  None
  See application file for complete search history.

(56) References Cited

U.S. PATENT DOCUMENTS 6,620,697 B1 * 9/2003 Alok ................... H01L 29/1608
                                                    438/303
7,151,422 B2  12/2006 Frisch et al.
(Continued)

FOREIGN PATENT DOCUMENTS

CN    206614131 U    11/2017
CN    107707136 A    2/2018
(Continued)

OTHER PUBLICATIONS

Ji et al., "Overview of High Voltage SiC Power Semiconductor Devices: Development and Applicaiton," *CES Transactions on Electrical Machines and Systems*, 1, 3, 254-264, Sep. 2017, China Electrotechnical Society, Beijing, China.
(Continued)

*Primary Examiner* — Dedei K Hammond
(74) *Attorney, Agent, or Firm* — LEYDIG, VOIT & MAYER, LTD.

(57) ABSTRACT

A power converter configured to generate a high-frequency power signal comprises at least one amplifier stage having first and second amplifier paths each having an amplifier, the first amplifier path outputting a first amplifier path output signal and the second amplifier path outputting a second amplifier path output signal that, has a phase shift relative to the first amplifier path output signal greater than 0° and less than 180°. The first and second amplifier paths are connected to a phase-shifting coupler that is configured to couple the first and second amplifier path output signals to form the high-frequency power signal. At least one amplifier of the first and second amplifier paths comprises a SiC MOSFET.

44 Claims, 2 Drawing Sheets

(56) References Cited

U.S. PATENT DOCUMENTS

| | | |
|---|---|---|
| 7,477,114 B2 | 1/2009 | Pivit et al. |
| 8,133,347 B2 | 3/2012 | Hintz et al. |
| 9,000,738 B2 | 4/2015 | Heid |
| 9,648,716 B2 | 5/2017 | Tian et al. |
| 9,684,327 B2 | 6/2017 | Fritsch et al. |
| 2003/0215373 A1 | 11/2003 | Reyzelman et al. |
| 2004/0161535 A1 | 8/2004 | Goundar et al. |
| 2005/0255809 A1 | 11/2005 | Glueck |
| 2010/0194195 A1 | 8/2010 | Coumou et al. |
| 2013/0038226 A1 | 2/2013 | Labanc |
| 2016/0300695 A1* | 10/2016 | Alt .............. H01L 29/7835 |
| 2017/0064802 A1* | 3/2017 | Tran .............. H02M 7/537 |
| 2017/0345620 A1 | 11/2017 | Coumou et al. |
| 2018/0123212 A1 | 5/2018 | Alt et al. |
| 2019/0007004 A1* | 1/2019 | Raymond .............. H03F 1/0205 |

FOREIGN PATENT DOCUMENTS

| | | |
|---|---|---|
| EP | 1601098 B1 | 7/2009 |
| EP | 2202776 B1 | 2/2012 |
| JP | 2010219026 A | 9/2010 |
| WO | WO 2010091696 A1 | 8/2010 |
| WO | WO 2010091697 A1 | 8/2010 |
| WO | WO 2016050685 A1 | 4/2016 |

OTHER PUBLICATIONS

ROHM Semiconductor, "SCT2H12NZ—N-channel SiC power MOSFET Datasheet," *ROHM Semiconductor*, Jul. 2017, pp. 1-14, ROHM Semiconductor, Chicago, USA.

Digikey, "1700 V Silicon Carbide (SiC) Diodes, MOSFETs, and Modules," online catalog, www.digikey.de; *Digi-Key*, Mar. 2016, pp. 1-3, DigiKey, Chicago, USA.

Yusuke Kikuchi et al ., "Diamond-like carbon film preparation using a highrepetition nanosecond pulsed glow discharge plasma at gas pressure of 1 kPa generated by a SiC-MOSFET inverter power supply", Japanese Journal of Applied Physics, Tokyo, Japan.

\* cited by examiner

POWER CONVERTER, POWER SUPPLY SYSTEM AND HF PLASMA SYSTEM

CROSS-REFERENCE TO PRIOR APPLICATIONS

This application is a continuation of International Patent Application No. PCT/EP2019/070375, filed on Jul. 29, 2019, which claims priority to European Patent Application No. EP 18461598.7, filed on Aug. 2, 2018. The entire disclosure of both applications is hereby incorporated by reference herein.

FIELD

The invention relates to power converters and power supply systems for generating high-frequency power that can be supplied to a plasma process and a high-frequency (HF) plasma system.

BACKGROUND

Power supply systems, in particular systems which generate power at frequencies larger than 300 kHz and at more than 1 kW are used for example for plasma processes like plasma dry etch processes, plasma coating installations or the like.

In US 2017/0064802 A1 a power supply system for a reactive gas generator is presented, for which the use of metal-oxide-semiconductor field-effect transistors, bipolar junction transistors, insulated-gate bipolar transistors or silicon carbide (SiC) transistors is suggested.

In a power supply system for plasma processes abrupt changes in the required power may occur, for example if an arc occurs in the plasma chamber and the supplied power has to be adapted accordingly. On the other hand, the power required for igniting the plasma may be different from one for operating the plasma process. When the plasma state changes, so does the impedance of the load. This likewise results in an abrupt change in the load. It is often not possible to adjust the impedance sufficiently rapidly, and so the power is reflected by the load. Also, if multiple power supplies with different frequencies are coupled to a plasma process, like for example a plasma dry etch process, the power reflected to a power supply might present a large variety of frequencies. Power with a large variety of frequencies might therefore be coupled back to a power supply and needs to be dealt with.

Among others, it is one object of the invention to improve the stability and the tolerance to reflected power.

A power converter that may generate a high-frequency power signal for a plasma process may comprise at least one amplifier stage having first and second amplifier paths each having an amplifier. The first amplifier path may output a first amplifier path output signal and the second amplifier path may output a second amplifier path output signal that, with respect to the first amplifier path output signal, has a phase shift greater than 0° and less than 180°. The first and second amplifier paths may be connected to a phase-shifting coupler that may be configured to couple the first and second amplifier path output signals to form the high-frequency power signal. At least one amplifier of the first and second amplifier paths may comprise a SiC MOSFET.

A phase-shifting coupler is understood to be a unit that couples two input signals to an output signal that is phase-shifted relative to at least one of the input signals. The phase-shifting coupler may have a coupler and optionally a phase-shifting network for each of one or more amplifier paths, wherein, during proper operation, the input signals of the coupler may have a phase position with respect to one another which is not 0° and not 180° and in particular is greater than 0° and less than 180°. For example, the input signals may be phase-shifted by 90°. The phase-shifting coupler may be a 90° hybrid coupler or 3 dB coupler.

A 3 dB coupler also called "hybrid coupler" and its behavior in the field of plasma power supplies is described in U.S. Pat. Nos. 7,151,422 B2, 7,477,114 B2, US 2018/0123212 A1, US 2013/0038226 A1, EP 2 202 776 B1, U.S. Pat. No. 8,133,347 B2, e.g., in the meaning of this application a 3 dB coupler behaves as described in these documents.

The phase-shifting coupler, in particular the 90° hybrid coupler or 3 dB coupler, may have an impedance at its input and output ports in the range from 10 Ω to 100Ω, in particular from 30Ω to 60Ω.

SUMMARY

In an embodiment, the present invention provides a power converter configured to generate a high-frequency power signal for a plasma process. The power converter includes at least one amplifier stage having first and second amplifier paths each having an amplifier. The first amplifier path outputs a first amplifier path output signal and the second amplifier path outputs a second amplifier path output signal that has a phase shift relative to the first amplifier output signal greater than 0° and less than 180°. The first and second amplifier paths are connected to a phase-shifting coupler that is configured to couple the first and second amplifier path output signals to form the high-frequency power signal. At least one of the amplifiers of the first and second amplifier paths comprises a SiC MOSFET.

In an embodiment of the invention, the SiC MOSFET may be a high-voltage SiC MOSFET. High-voltage SiC MOSFETs are a new generation of Silicon Carbide (SiC) MOSFETs with a maximum rated voltage between Drain and Source of 1.500 V or larger, preferably of 600 V or larger. Typical applications of SiC MOSFETs are so far for example solar inverters, DC/DC converters, switch-mode power supplies, induction heating or motor drives.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

Figure 1:
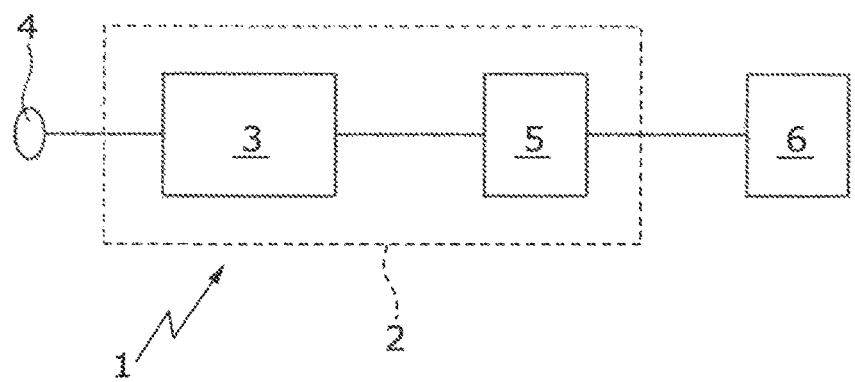
FIG. 1 represents a schematic of a plasma system comprising a power supply system and a load.

High-voltage SiC MOSFETs have timing characteristics with often more than 70 ns rise-time or fall-time, which would suggest that the use of them in high-frequency applications might be difficult. One embodiment of the invention suggests to combine at least one amplifier with a high-voltage SiC MOSFET with a phase-shifting coupler which inhibits multiple reflections from a load, e.g. the plasma, to the amplifiers. In such an embodiment, high-voltage SiC MOSFETs exhibit advantageous characteristics and prove to be stable.

In an embodiment at least one amplifier of the first and second amplifier paths of the power converter may be a switch-mode amplifier.

First and second amplifier paths of the power converter are connected to the phase-shifting coupler, which is also understood to be a coupler which is configured to feed reflected power, which is conducted from the load, e.g. the plasma load, through the coupler back to the amplifiers with a different phase, i.e. a phase shift. A load may change its impedance over time. The status when the impedance of the load is not the same as the impedance of the source is called "impedance mismatch" or "mismatch". In the event of impedance mismatching of the load, a part of the delivered power will be reflected to the source. If the source is a power supply with a phase shifting coupler, 90° hybrid coupler for example, this coupler may divide the reflected power fed back from the load between its two input connectors in a manner phase-shifted by 90°. The reflected power may then be fed back to the amplifiers connected to the input connectors in the phase-shifted manner.

Because the coupler changes the phase of the reflected power, the amplifiers are confronted with a phase change in the reflected power. Switch-mode amplifiers may be designed to close a switch when the voltage between the outputs of the switches is zero or near zero. This is then called soft switching.

In the situation of reflected power change of phase caused by the phase-shifting coupler may bring the switches in the situation that they have to switch when the voltage between the outputs of the switches is not zero. This is then called hard switching and might be bad for the switches and bears the risk of causing damage to them. This is in particular relevant in a plasma power supply system, where the impedance changes often, rapidly and to a high degree. This damage of the switches might happen in particular with the fast switching MOSFETs which are usually used in frequencies above 300 kHz. It was found that using SiC MOSFET for at least one or possibly each of the amplifiers in the power converter might render the power converter more reliable in these hard switching conditions as described above although these SiC MOSFETs were in the past not recommended for plasma power supplies, perhaps due to their critical timing behaviour at frequencies above 300 kHz. This increased reliability may be due to the use of at least one SiC MOSFET in at least one amplifier of the power converter.

In an embodiment of the invention, the switch-mode amplifier may be a class D or a class E amplifier.

In one embodiment the amplifier might be configured to work in a class F or inverse Class F (Class $F^{-1}$) mode.

The basic circuits and functionality of switch-mode amplifiers such as Class D, E, F or class $F^{-1}$ amplifiers are described e.g. in EP1601098B1 in particular in FIGS. 1 and 2A-2F and corresponding paragraphs [006] to [0014]. The use of SiC MOSFETs in such kind of amplifiers may allow an increase of DC link voltage which means more power per transistor. For example, Class E usage might therefore be extended.

In an embodiment of the invention, the power converter is connected to a load, e.g. a plasma load and may output the high-frequency power signal to the load via an output connector. Especially plasma processes above 1 kW have a fast varying impedance and the power supply needs to be tolerant towards reflected power.

The power supply system may be configured to generate power at frequencies larger than 300 kHz and lower than 10 MHz, in particular larger than 1 MHz, and, in particular lower than 5 MHz. In this region the above mentioned advantages are notably visible.

In one embodiment of the invention, the phase shifting coupler may comprise a connector that is connected to ground via an absorbing resistor. An absorbing resistor is configured to absorb a significant amount of power, which may be at least 10% of the output power. The absorbing resistor may have a value which is in the range from 10Ω to 100Ω, in particular from 30Ω to 60Ω. The phase-shifting coupler may also be understood to be a unit which has a first input impedance at the first input connector and a second input impedance at the second input connector and which is configured in such a way that the input impedances are equal when no reflected power is being passed through the coupler to the input connectors and are different when reflected power is being passed through the coupler to the input connectors.

With the phase-shifting coupler comprised in the power converter, the two amplifier paths connected to the coupler may experience different impedances in the event of mismatching. Moreover, in the event of mismatching, power may not be reflected back to the amplifier paths but can instead be dissipated into an absorbing resistor.

One amplifier, in particular each amplifier, may have an output impedance at its output that may be different from the input impedance of the coupler. In this case the amplifier reflects the majority of the power conducted thereto back to the coupler in the case of reflected power from the load. The coupler then conducts the power into an absorbing resistor. This improves the stability and the reliability of the system.

In the case when, for example, multiple power supplies with different frequencies are coupled to a plasma process, e.g. dry etch process, reflected power with a large variety of frequencies may be coupled back into a power supply and power converter.

In an embodiment of the invention, the power converter comprises first circuitry that is configured to perform a wideband measurement of the signal at the output connector of the power converter. The wideband measurement may allow to measure also frequencies which are different from the frequency supplied by the power converter. Such frequencies might for example be frequencies reflected back from the load which may be connected to the output connector of the power converter.

One embodiment of the power converter may comprise a voltage supply configured to supply voltage to the first a second amplifier paths. Second circuitry may be configured to control the voltage supply and may be connected to the first circuitry configured to perform a wideband measurement of the output signal. The first circuitry may comprise for example an analogue-to-digital converter with a high sampling rate and be connected to a fast digital evaluation, e.g. a PLD (Programmable Logic Device). The second circuitry may receive the output of the first circuitry comprising information relating to the frequency, voltage and current of the signal at the output of the power supply. The second circuitry may then adjust the voltage supply to the first and second amplifier paths in response to the received signal from the first circuitry.

The power converter may further comprise a third circuitry configured to measure data relating to the absorbing resistor.

In an embodiment of the invention, the power converter may comprise an adjustable voltage supply configured to supply the at least one amplifier with voltage and a fourth circuitry measuring the signal output by the adjustable voltage supply.

In further embodiments of the invention additional signals and values inside the power supply could be measured and/or influenced in response to the signal output by the first circuitry, e.g. DC link voltage, DC link current, DC link power, an absorbing resistor voltage or temperature. The measured values might be the basis for a learning process where other values are influenced, the result is measured and then the influence on such values is adjusted. The procedure would then be similar to a closed-loop control of the system. The learning process may be realised by a neural network.

In further embodiments of the invention, there might be additional communication channels outside the power supply, e.g. communicating the status of the power supply to an overall system control and/or to possible other power supplies in the system.

One aspect of the invention features a power supply system that may be connected to an electrode in a plasma process and configured to supply high-frequency power to the electrode in the plasma process. The power supply system may comprise a power converter with at least one amplifier stage having first and second amplifier paths each having an amplifier. The first amplifier path may output a first amplifier path output signal and the second amplifier path may output a second amplifier path output signal that, with respect to the first amplifier path output signal, may have a phase shift greater than 0° and less than 180°, for example 90°. The first and second amplifier paths are may be connected to a phase-shifting coupler that may be configured to couple the first and second amplifier path output signals to form a high-frequency power signal. At least one amplifier of the first and second amplifier paths may comprise a SiC MOSFET.

One aspect of the invention features a high-frequency plasma system which may comprise a plasma chamber in which a least one electrode may be arranged and a power supply system which may be connected to the electrode and configured to supply high-frequency power to the electrode.

In order that the features and advantages of the present invention may be further appreciated embodiments will now be described, by way of example only, with reference to the accompanying schematic drawings, of which:

DETAILED DESCRIPTION

FIG. 1 shows a plasma system 1 which comprises a power supply system 2. The power supply system 1 in turn comprises a power converter 3 which can be connected to a voltage supply network 4. The power generated at the output of the power converter 3 is passed via an impedance matching network 5 to a load 6, which may for example be a plasma chamber in which a plasma is generated which can be used for plasma machining in the plasma chamber. In particular, a workpiece can be etched or a material layer can be applied to a substrate. The load 6 may also be gas laser excitation.

Figure 2:
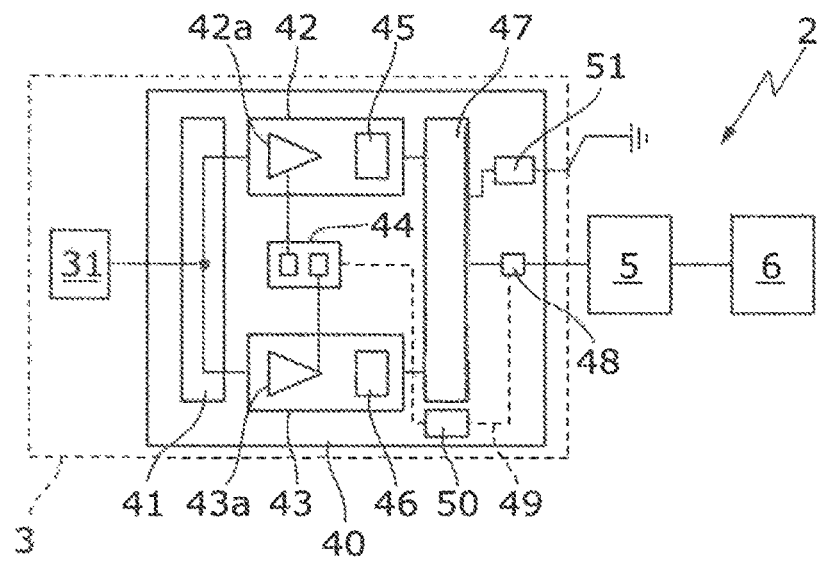
FIG. 2 represents a schematic view of a power converter comprising amplifiers and a coupler.

FIG. 2 is a highly schematic drawing of a power supply system 2. The power supply system 2 has a power converter 3 which generates an output power which can be supplied to a load 6, for example a plasma process or a laser excitation. An impedance matching network 5 can be arranged between the load 6 and the power converter 3.

A digital-to-analogue converter (DAC) 31 generates an analogue output signal. The generated analogue signal is supplied to an amplifier stage 40 and, therein, in particular to a splitter 41. The splitter 41 can be configured as a hybrid coupler which divides the analog signal into two phase-shifted signals, in particular signals phase-shifted by 90°. One signal emitted by splitter 41 may be supplied to a first amplifier path 42 and the other signal emitted by splitter 41 may be supplied to a second amplifier path 43. The amplifier paths 42, 43 each have at least one amplifier 42a, 43a, it being possible for the amplifiers 42a, 43a to be formed as push-pull amplifiers and thus each to have two transistors, in particular two SiC MOSFET transistors. The voltage supply of the amplifier paths 42, 43 and thus of the amplifiers 42a, 43a and the transistors contained therein, is provided by way of a voltage supply 44. At the output of each amplifier path 42, 43, an output network 45, 46 is provided, said networks adapting the output impedances of the amplifiers 42a, 43a to the input impedance of a phase-shifting coupler 47 and simultaneously filtering undesired harmonics. In the phase-shifting coupler 47, the output signals of the amplifier paths 42, 43 are coupled in a phase-dependent manner to form an output signal, which is ultimately passed to the load 6 via the optional impedance matching network 5. The phase-shifting coupler 47 is connected to ground via an absorbing resistor 51. Preferably, the phase-shifting coupler 47 is a 90° hybrid coupler.

The output power at the output of the coupler 47 can be detected by first circuitry 48, e.g. appropriate wideband measurement circuitry. The dashed line 49 indicates that the wideband measurement circuitry is connected to a second circuitry 50, e.g. a voltage regulation system, which in turn actuates the voltage supply 44. In particular, the first circuitry 48 can also detect the power supplied to the load 6 and the power reflected by the load 6. The detection can comprise in particular voltage, current and frequency of the signal supplied to the load 6 and reflected by the load 6. From these values a signal indicative of the reflection of the load 6 can be generated and used to influence the supplied voltage and other factors, as will be described with respect to FIG. 3.

Figure 3:
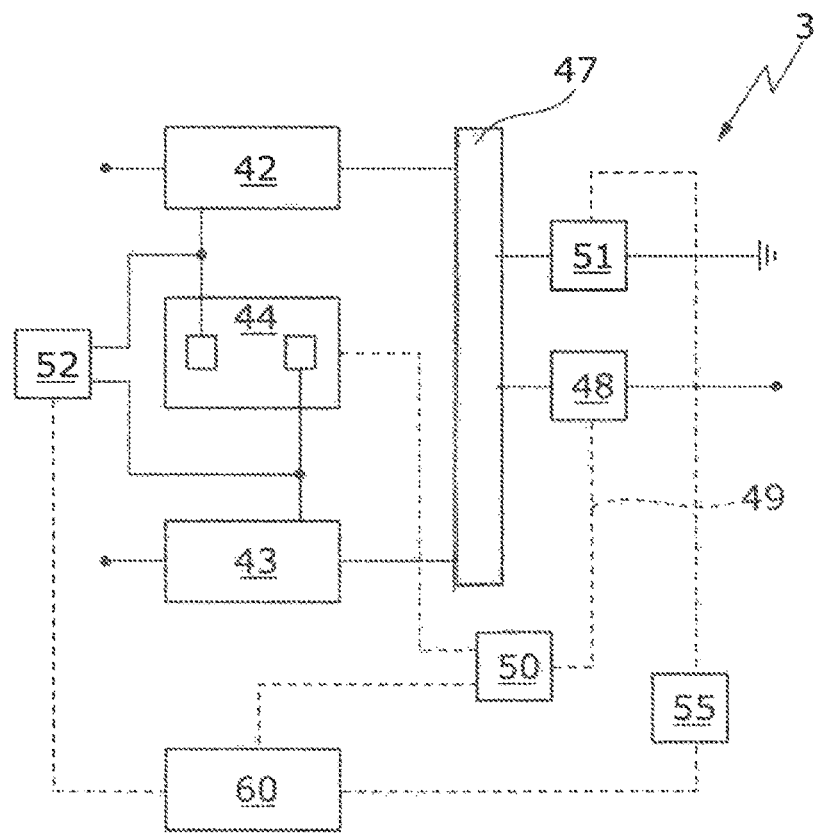
FIG. 3 represents schematic view of a power converter comprising further measurement circuitry.

FIG. 3 is a highly schematic drawing of a power converter 3 comprising first and second amplifier paths 42, 43 and a voltage supply 44 supplying voltage to the first and second amplifier paths 42, 43 and the amplifiers comprised therein. Instead of one voltage supply 44 also two voltage supplies could be used supplying voltage to the first and second amplifier paths 42, 43 each. A phase-shifting coupler 47 couples the output signals of the amplifier paths 42, 43 to form the high-frequency power signal of the power converter 3. The phase-shifting coupler 47 is connected to ground via an absorbing resistor 51. The absorbing resistor 51 may allow to absorb power reflected by load 6. The power converter 3 further comprises first circuitry 48, second circuitry 50, third circuitry 55 and fourth circuitry 52.

First circuitry 48 is configured to perform voltage and current measurement of the output signal of the phase-shifting coupler 47 over a broad frequency range. In particular, the broad range of frequencies that is measured may include the power converter's 3 own frequency or frequencies as well as a broad range of frequencies lying outside the power converter's 3 own frequency range. First circuitry 48 may comprise an analogue-to-digital converter (ADC) with a high sampling rate and a fast digital evaluation unit, e.g. a PLD.

First circuitry 48 outputs a signal relating to the measurement results to the second circuitry 50. Second circuitry 50 is configured to control the voltage supply 44. The second circuitry 50 may control the voltage supplied to the amplifier paths 42, 43 via the voltage supply 44. The second circuitry may also be connected to a system control 60.

The third circuitry 55 is configured to measure data relating to the absorbing resistor 51. Examples for data measured are the voltage at the absorbing resistor 51 and/or its temperature.

The fourth circuitry 52 is configured to measure the voltage output by the voltage supply 44. This measurement may allow for the fourth circuitry 52 to feed back the voltage output by the voltage supply 44 to a system control 60.

The system control 60 may use different kinds of measurements, like for example DC link voltage, DC link current, DC link power, the absorbing resistor voltage and/or the absorbing resistor temperature. A learning process might be performed within the system control 60 and it may communicate with other power supplies and/or an overall plasma system control. The data fed to the system control 60 may be used to implement a closed-loop control of e.g. the power converter and/or the plasma system.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A power converter configured to generate a high-frequency power signal for a plasma process, the power converter comprising: at least one amplifier stage having first and second amplifier paths each having an amplifier, the first amplifier path outputting a first amplifier path output signal and the second amplifier path outputting a second amplifier path output signal that has a phase shift relative to the first amplifier output signal greater than 0° and less than 180°; a voltage supply configured to supply voltage to the first and second amplifier paths; an output connector configured to output the high-frequency power signal to a plasma load connected to the output connector; a first circuitry configured to perform a wideband measurement of the signal at the output connector a second circuitry configured to control the voltage supply in response to a received signal from the first circuitry, wherein the second circuitry is connected to the first circuitry; an absorbing resistor, wherein a phase shifting coupler is connected to ground via the absorbing resistor; and a third circuitry configured to measure data relating to the absorbing resistor, wherein the first and second amplifier paths are connected to the phase-shifting coupler that is configured to couple the first and second amplifier path output signals to form the high-frequency power signal, wherein at least one of the amplifiers of the first and second amplifier paths comprises a SiC MOSFET.

2. The power converter according to claim 1, wherein the SiC MOSFET is a high-voltage SiC MOSFET.

3. The power converter according to claim 2, wherein the SIC MOSFET is used to amplify a high-frequency signal with a frequency larger than 300 kHz and lower than 10 MHz.

4. The power converter according to claim 3, wherein the SIC MOSFET is used to amplify a high-frequency signal with a frequency larger than 1 MHz.

5. The power converter according to claim 4, wherein the SIC MOSFET is used to amplify a high-frequency signal with a frequency lower than 5 MHz.

6. The power converter according to claim 1, wherein the at least one amplifier of the first and second amplifier paths is a switch-mode amplifier.

7. The power converter according to claim 6, wherein the switch-mode amplifier is a class D or a class E amplifier.

8. The power converter according to claim 1, further comprising:
an adjustable voltage supply configured to supply the at least one amplifier stage with voltage; and
a fourth circuitry configured to measure a signal output by the adjustable voltage supply.

9. A power supply system connected to an electrode in a plasma process and configured to supply high-frequency power to the electrode in the plasma process, the power supply system comprising a power converter according to claim 1.

10. The power converter according to claim 1, wherein the third circuitry is configured to measure a voltage at the absorbing resistor and/or a temperature of the absorbing resistor.

11. The power converter according to claim 1, further comprising measurement circuitry configured to measure a power supplied to the plasma load and a power reflected by the plasma load.

12. The power converter according to claim 11, wherein the measurement circuitry is configured to measure a voltage, current, and frequency of the high-frequency power signal output to the plasma load and a voltage, current, and frequency of a signal reflected by the plasma load.

13. A high-frequency plasma system comprising:
a plasma chamber in which at least one electrode is arranged;
a first power supply system connected to the at least one electrode and configured to supply high-frequency power to the at least one electrode, the first power supply system comprising:
a power converter configured to generate a high-frequency power signal for a plasma process, the power converter comprising:
at least one amplifier stage having first and second amplifier paths each having an amplifier, the first amplifier path outputting a first amplifier path output signal and the second amplifier path outputting a second amplifier path output signal that has a phase shift relative to the first amplifier output signal greater than 0° and less than 180°, wherein the first and second amplifier paths are connected to a phase-shifting coupler that is configured to couple the first and second amplifier path output signals to form the high-frequency power signal, and wherein at least one of the amplifiers of the first and second amplifier paths comprises a SiC MOSFETs; and multiple additional power supplies with different frequencies coupled to the plasma process, wherein a reflected power with a large variety of frequencies is coupled back into the power supply system and the power converter.

14. The high-frequency plasma system according to claim 13, wherein the SiC MOSFET is a high-voltage SiC MOSFET.

15. The high-frequency plasma system according to claim 14, wherein the SIC MOSFET is used to amplify a high-frequency signal with a frequency larger than 300 kHz and lower than 10 MHz.

16. The high-frequency plasma system according to claim 15, wherein the SIC MOSFET is configured to amplify a high-frequency signal with a frequency larger than 1 MHz.

17. The high-frequency plasma system according to claim 16, wherein the SIC MOSFET is configured to amplify a high-frequency signal with a frequency lower than 5 MHz.

18. The high-frequency plasma system according to claim 13, wherein the at least one amplifier of the first and second amplifier paths is a switch-mode amplifier.

19. The high-frequency plasma system according to claim 18, wherein the switch-mode amplifier is a class D or a class E amplifier.

20. The high-frequency plasma system according to claim 13, wherein the power convert further comprises an output connector configured to output the high-frequency power signal to a plasma load connected to the output connector.

21. The high-frequency plasma system according to claim 20, wherein the power converter further comprises a first circuitry configured to perform a wideband measurement of the signal at the output connector.

22. The high-frequency plasma system according to claim 21, wherein the power converter further comprises a voltage supply configured to supply voltage to the first and second amplifier paths, and a second circuitry configured to control the voltage supply in response to a received signal from the first circuitry, wherein the second circuitry is connected to the first circuitry.

23. The high-frequency plasma system according to claim 22, wherein the power converter further comprises:
an absorbing resistor, wherein the phase shifting coupler is connected to ground via the absorbing resistor; and
a third circuitry configured to measure data relating to the absorbing resistor.

24. The high-frequency plasma system according to claim 23, wherein the power converter further comprises:
an adjustable voltage supply configured to supply the at least one amplifier stage with voltage; and
a fourth circuitry configured to measure a signal output by the adjustable voltage supply.

25. The high-frequency plasma system according to claim 23, wherein the third circuitry is configured to measure a voltage at the absorbing resistor and/or a temperature of the absorbing resistor.

26. The high-frequency plasma system according to claim 20, wherein the power converter further comprises measurement circuitry configured to measure a power supplied to the plasma load and a power reflected by the plasma load.

27. The high-frequency plasma system according to claim 26, wherein the measurement circuitry is configured to measure a voltage, current, and frequency of the high-frequency power signal output to the plasma load and a voltage, current, and frequency of a signal reflected by the plasma load.

28. The high-frequency plasma system according to claim 27, wherein the measurement circuitry includes an analog-to-digital converter (ADC) and a programmable logic device (PLD).

29. The high-frequency plasma system according to claim 26, wherein the power converter further comprises an absorbing resistor, wherein the phase shifting coupler is connected to ground via the absorbing resistor, wherein the absorbing resistor is configured to absorb at least a portion of the power reflected by the plasma load.

30. A power converter configured to generate a high-frequency power signal for a plasma process, the power converter comprising:
at least one amplifier stage having first and second amplifier paths each having an amplifier, the first amplifier path outputting a first amplifier path output signal and the second amplifier path outputting a second amplifier path output signal that has a phase shift relative to the first amplifier output signal greater than 0° and less than 180°, wherein the first and second amplifier paths are connected to a phase-shifting coupler that is configured to couple the first and second amplifier path output signals to form the high-frequency power signal, and wherein at least one of the amplifiers of the first and second amplifier paths comprises a SiC MOSFET;
an output connector configured to output the high-frequency power signal to a plasma load connected to the output connector;
measurement circuitry configured to measure a power supplied to the plasma load and a power reflected by the plasma load; and
an absorbing resistor, wherein the phase shifting coupler is connected to ground via the absorbing resistor, wherein the absorbing resistor is configured to absorb at least a portion of the power reflected by the plasma load.

31. The power converter according to claim 30, wherein the SiC MOSFET is a high-voltage SiC MOSFET.

32. The power converter according to claim 31, wherein the SIC MOSFET is used to amplify a high-frequency signal with a frequency larger than 300 kHz and lower than 10 MHz.

33. The power converter according to claim 30, wherein the at least one amplifier of the first and second amplifier paths is a switch-mode amplifier.

34. The power converter according to claim 30, further comprising a first circuitry configured to perform a wideband measurement of the signal at the output connector.

35. The power converter according to claim 34, further comprising a voltage supply configured to supply voltage to the first and second amplifier paths, and a second circuitry configured to control the voltage supply in response to a received signal from the first circuitry, wherein the second circuitry is connected to the first circuitry.

36. A power converter configured to generate a high-frequency power signal for a plasma process, the power converter comprising:
at least one amplifier stage having first and second amplifier paths each having an amplifier, the first amplifier path outputting a first amplifier path output signal and the second amplifier path outputting a second amplifier path output signal that has a phase shift relative to the first amplifier output signal greater than 0° and less than 180°, wherein the first and second amplifier paths are connected to a phase-shifting coupler that is configured to couple the first and second amplifier path output signals to form the high-frequency power signal, and wherein at least one of the amplifiers of the first and second amplifier paths comprises a SiC MOSFET;

an output connector configured to output the high-frequency power signal to a plasma load connected to the output connector; and measurement circuitry configured to measure a power supplied to the plasma load and a power reflected by the plasma load, wherein the measurement circuitry is configured to measure a voltage, current, and frequency of the high-frequency power signal output to the plasma load and a voltage, current, and frequency of a signal reflected by the plasma load, and wherein the measurement circuitry includes an analog-to-digital converter (ADC) and a programmable logic device (PLD).

37. The power converter according to claim 36, wherein the SiC MOSFET is a high-voltage SiC MOSFET.

38. The power converter according to claim 37, wherein the SIC MOSFET is used to amplify a high-frequency signal with a frequency larger than 300 kHz and lower than 10 MHz.

39. The power converter according to claim 36, wherein the at least one amplifier of the first and second amplifier paths is a switch-mode amplifier.

40. The power converter according to claim 36, further comprising a first circuitry configured to perform a wideband measurement of the signal at the output connector.

41. The power converter according to claim 40, further comprising a voltage supply configured to supply voltage to the first and second amplifier paths, and a second circuitry configured to control the voltage supply in response to a received signal from the first circuitry, wherein the second circuitry is connected to the first circuitry.

42. The power converter according to claim 41, further comprising:

an absorbing resistor, wherein the phase shifting coupler is connected to ground via the absorbing resistor; and a third circuitry configured to measure data relating to the absorbing resistor.

43. The power converter according to claim 42, further comprising:

an adjustable voltage supply configured to supply the at least one amplifier stage with voltage; and a fourth circuitry configured to measure a signal output by the adjustable voltage supply.

44. The power converter according to claim 42, wherein the third circuitry is configured to measure a voltage at the absorbing resistor and/or a temperature of the absorbing resistor.

* * * * *